United States Patent [19]

Satoh

[11] Patent Number: 5,013,939

[45] Date of Patent: May 7, 1991

[54] THIN-FILM TRANSISTOR ARRAY

[75] Inventor: Yoshihide Satoh, Kanagawa, Japan

[73] Assignee: Fuji Xerox Co., Ltd., Tokyo, Japan

[21] Appl. No.: 405,536

[22] Filed: Sep. 11, 1989

[30] Foreign Application Priority Data

Sep. 12, 1988 [JP] Japan .................. 63-228188

[51] Int. Cl.[5] .................. H03K 19/094; H03K 17/84; H03K 17/693; H01L 29/78
[52] U.S. Cl. .................. 307/468; 307/298; 307/443; 307/572; 307/304
[58] Field of Search ............... 307/465, 468, 298, 304, 307/443, 572, 263; 357/23.7, 45

[56] References Cited

U.S. PATENT DOCUMENTS

| | | | |
|---|---|---|---|
| 4,511,814 | 4/1985 | Matsuo et al. | 307/572 |
| 4,752,703 | 6/1988 | Lin | 307/443 X |
| 4,883,986 | 11/1989 | Egawa et al. | 307/298 |
| 4,894,690 | 1/1990 | Okabe et al. | 357/45 X |
| 4,916,514 | 4/1990 | Nowak | 357/45 X |

FOREIGN PATENT DOCUMENTS 0140067 12/1978 Japan ...................... 307/298

OTHER PUBLICATIONS

Eaton, "Sapphire Brings Out the Best In CMOS", Electronics, pp. 115-118, Jun. 12, 1975.

Primary Examiner—Stanley D. Miller
Assistant Examiner—David Bertelson
Attorney, Agent, or Firm—Spensley, Horn, Jubas & Lubitz

[57] ABSTRACT

A plurality of thin-film transistors constituting an array are successively switched on by gate signals. Feed-through correction capacitances are respectively connected between an output terminal of each thin-film transistor switched on by a certain gate signal and a predetermined number of gate lines for supplying subsequent gate signals. A decrease in an output voltage of each thin-film transistor caused by transmission of a fall of the gate signal to the output terminal via a gate-source capacitance is compensated for by a rise of the subsequent gate signal which is transmitted to the output terminal via the feed-through correction capacitance.

6 Claims, 3 Drawing Sheets

THIN-FILM TRANSISTOR ARRAY

BACKGROUND OF THE INVENTION

The present invention relates to a thin-film transistor array to be used as a driver or switching circuit in printers, contact-type image sensors, display devices and the like.

Referring to FIG. 1, there is shown an example of a conventional thin-film transistor array.

In FIG. 1, $Q_1$ to $Q_3$ represent thin-film transistors which form a thin-film transistor array; $V_{G1}$ to $V_{G3}$ represent gate signals; $V_{D1}$ to $V_{D3}$, data signals; $C_{L1}$ to $C_{L3}$, load capacitances; $V_{O1}$ to $V_{O3}$, output signals; $C_{GS1}$ to $C_{GS3}$, gate-source capacitances; S, a source; D, a drain; G, a gate. Although only three transistors are shown in FIG. 1, it is to be understood that a large number of transistors are arranged in practical use.

The operation of each thin-film transistor in such a thin-film transistor array will be described with reference to an arbitrary thin-film transistor (for example, $Q_1$).

An outline of the operation is as follows. When a thin-film transistor $Q_1$ is turned on by a gate signal $V_{G1}$, a load capacitance $C_{L1}$ is charged by a data signal $V_{D1}$. A resultant voltage across the load capacitance $C_{L1}$ is used as an output signal $V_{O1}$.

The detail of the operation will be described with reference to FIG. 2 which shows waveforms for explaining the operation of one thin-film transistor $Q_1$ in FIG. 1. In FIG. 2, the diagrams (a), (b) and (c) show respective waveforms of the data signal $V_{D1}$, gate signal $V_{G1}$, and output signal $V_{O1}$.

In the following, the operation is described with the passage of time.

(1) Operation from $t_1$ to $t_2$

The gate signal $V_{G1}$ is turned to a high value $V_{GG}$ by a pulse $b_1$, so that the thin-film transistor $Q_1$ is switched on. At the same time, the data signal $V_{D1}$ is turned to a high value $V_{DD}$ by a pulse a. Accordingly, the load capacitance $C_{L1}$ is charged by the data signal having the value $V_{DD}$, and a resultant voltage across the load capacitance $C_{L1}$ is outputted as an output signal $V_{O1}$.

The waveform of the output signal $V_{O1}$ shown in FIG. 2(c) is drawn so as to jump by $\Delta V$ at the time $t_1$ relative to the preceding value. This is because when the gate signal $V_{G1}$ rises to $V_{GG}$, the rapid change of the voltage is transmitted to the source S through the gate-source capacitance $C_{GS1}$ intrinsically existing between the gate G and source S to thereby increase a potential at the load capacitance $C_{L1}$.

This is called a feed-through phenomenon and the changed voltage $\Delta V$ is called a feed-through voltage. The value $\Delta V$ is expressed by the following equation:

$$\Delta V = \frac{C_{GS1}}{C_{L1} + C_{GS1}} \times V_{GG}$$

As the charging of the load capacitance $C_{L1}$ progresses, the value of the output signal $V_{O1}$ increases. Because the difference between the output signal value $V_{O1}$ and the data signal value $V_{GG}$ is reduced with the increase of the output signal value $V_{O1}$, a current flowing through the thin-film transistor $Q_1$ becomes small, so that the increase rate of the output signal $V_{O1}$ becomes small. It is not long before the output signal $V_{O1}$ reaches an output high-level peak $V_H$.

This process forms a waveform $c_1$ in FIG. 2(c). The output signal $V_{O1}$ is kept at the output high-level peak $V_H$ until the gate signal $V_{G1}$ falls at $t_2$.

(2) Operation from $t_2$ to $t_3$

When the gate signal $V_{G1}$ falls at the time $t_2$, the rapid potential change is transmitted to the source S through the gate-source capacitance $C_{GS1}$ to thereby decrease the potential at the load capacitance $C_{L1}$, i.e., the output signal $V_{O1}$. This decrease of the potential is also referred to as the feed-through voltage $\Delta V$, as described above.

A settled value after the decrease of the potential is an output high level $V_{OH}$. Because the thin-film transistor $Q_1$ is kept off until the gate signal $V_{G1}$ is turned to the high value $V_{GG}$ again at $t_3$, the output signal $V_{O1}$ is kept at the output high level $V_{OH}$. Some operation corresponding to the output high level is carried out in an external system using the value $V_{OH}$.

(3) Operation from $t_3$ to $t_4$

When a pulse $b_2$ of the gate signal $V_{G1}$ rises at the time $t_3$, the output signal $V_{O1}$ increases instantaneously by the feed-through voltage $\Delta V$ due to the feed-through phenomenon. Because the data signal $V_{D1}$ is, however, zero in a period from $t_3$ to $t_4$, the load capacitance $C_{L1}$ is discharged to reduce the output signal $V_{O1}$ to zero rapidly. This process forms a waveform $C_2$ in FIG. 2(c).

(4) Operation at and after $t_4$

When the pulse $b_2$ of the gate signal $V_{G1}$ falls at the time $t_4$, the output signal $V_{O1}$ decreases by the feed-through voltage $\Delta V$ due to the feed-through phenomenon, so that the output signal $V_{O1}$ takes a minus peak. The minus peak is referred to as an output low-level peak $V_L$.

Accordingly, relations between potentials around the thin-film transistor $Q_1$ immediately after the gate signal $V_{G1}$ becomes zero at $t_4$ are as follows. The potential (0) at the gate G is positive relative to the potential ($-\Delta V$) at the source S. The potential (0 as a value of the data signal $V_{D1}$) at the drain D is also positive relative to the potential at the source S.

It is, however, commonly known that the source S and drain D of the thin-film transistor are symmetric in structure, and the source S and drain D can serve interchangeably.

Therefore, a current continues to flow through the thin-film transistor Q even after $t_4$, so that the output signal $V_{O1}$ increases gradually from the output low-level peak $V_L$. Ultimately, the voltage between the source S and drain D is settled to the threshold voltage $V_{th}$ of the thin-film transistor $Q_1$, that is defined as a specific voltage level between the opposite ends (source S and drain D) of the thin-film transistor $Q_1$ with a voltage below which level no current can flow through the thin-film transistor $Q_1$. The settled value is referred to as an output low level $V_{OL}$. In short, $V_{OL} = -V_{th}$. This process forms a waveform $c_3$ in FIG. 2(c).

An operation to be conducted when the output signal $V_{O1}$ is low, is carried out in an external system using the output low level $V_{OL}$.

A description of such a thin-film transistor array is found in the literature by Malcolm J. Thompson and Hsing C. Tuan, entitled "Amorphous Si Electronic Devices and Their Applications", IEDM 86 pp. 192-195 (particularly, FIG. 8).

However, the following problems are caused by the feed-through phenomenon in the aforementioned conventional thin-film transistor arrays.

The first problem is that the output high level $V_{OH}$ is reduced by the feed-through voltage $\Delta V$ from the given data signal value $V_{D1}$ to a value often insufficient for a desired operation. To assure the desired operation, a voltage higher by the feed-through voltage $\Delta V$ than the output high level $V_{OH}$ must be prepared as the data signal $V_{D1}$.

The second problem is that the output low level $V_{OL}$ depends on the threshold voltage $V_{th}$ of the thin-film transistor which changes with the passage of time during the operation of the thin-film transistor. Accordingly, the output low level $V_{OL}$ cannot be stable. When the output low level $V_{OL}$ is not stable, for example the following disadvantage arises. This is, in the case where the thin-film transistor array is used in an image processing device or the like to attain a tonal feature, the potential difference between the output high level and low level is not stabilized, causing erroneous results.

SUMMARY OF THE INVENTION

An object of the present invention is to solve the aforementioned problems.

To solve the above problems, the present invention provides a thin-film transistor array having a plurality of thin-film transistors successively switched on by gate signals continuously generated, in which feed-through correction capacitances are respectively connected between an output terminal of each thin-film transistor switched on by a certain gate signal and a predetermined number of gate lines for supplying subsequent gate signals.

In each thin-film transistor, some capacitance intrinsically exists between a gate and source (or between a gate and drain) because of its structure. Therefore, when a gate signal pulse falls, an output potential of each thin-film transistor is reduced through the intrinsic capacitance (feed-through phenomenon).

If, however, feed-through correction capacitances are provided so as to be respectively connected between the output terminal of each thin-film transistor switched on by a certain gate signal and a predetermined number (for example, two) of subsequent gate lines for supplying the predetermined number (for example, two) of gate signals, the decrease of the output potential caused by the fall of the certain gate signal can be instantly compensated for by an increase thereof caused by a rise of the gate signal following the certain gate signal. Length of a total period of such correction can be determined suitably by establishment of the predetermined number.

Other and further objects, features and advantages of the invention will appear more fully from the following description taken in connection with the accompanying drawings.

DESCRIPTION OF THE PREFERRED EMBODIMENTS

Figure 3:
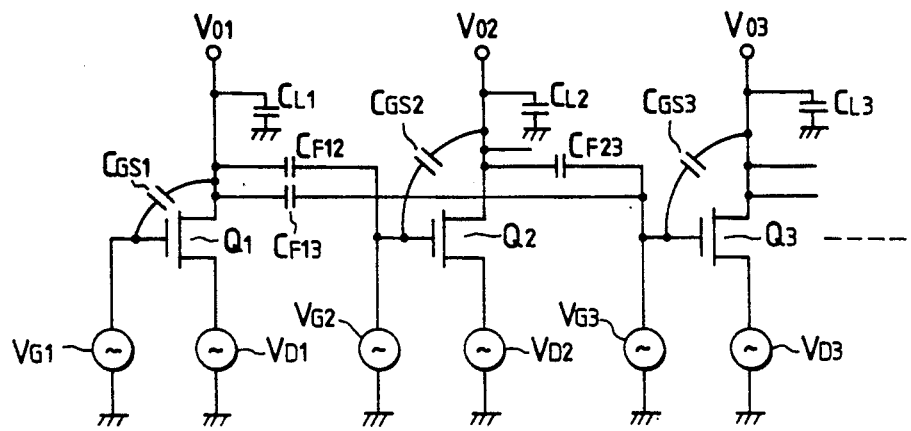
FIG. 3 is a diagram for explaining the basic concept of the present invention.

Preferred embodiments of the present invention will be described in detail with reference to the accompanying drawings. FIG. 3 is a diagram for explaining the basic concept of the invention. Reference characters in FIG. 3 correspond to those in FIG. 1. In FIG. 3, $C_{F12}$, $C_{F13}$ and $C_{F23}$ represent feed-through correction capacitances. That is, FIG. 3 is different from FIG. 1 only in that the feed-through correction capacitances are added.

The function of the feed-through correction capacitances is to instantly cancel a decrease of the output signal value caused by a fall of a gate signal through the feed-through phenomenon by utilizing an increase thereof caused by a rise of a succeeding gate signal. Accordingly, there can be prevented over a predetermined period the output signal decrease having an amount of the feed-through voltage $\Delta V$.

The invention assumes the case where the gate signals $V_{G1}$ to $V_{G3}$ take the same high level value $V_{GG}$ and are provided from a shift register or the like continuously such that the gate signal $V_{G2}$ is turned on at an instant when the gate signal $V_{G1}$ is turned off, and similarly the gate signal $V_{G3}$ is turned on at an instant when the gate signal $V_{G2}$ is turned off.

Figure 4:
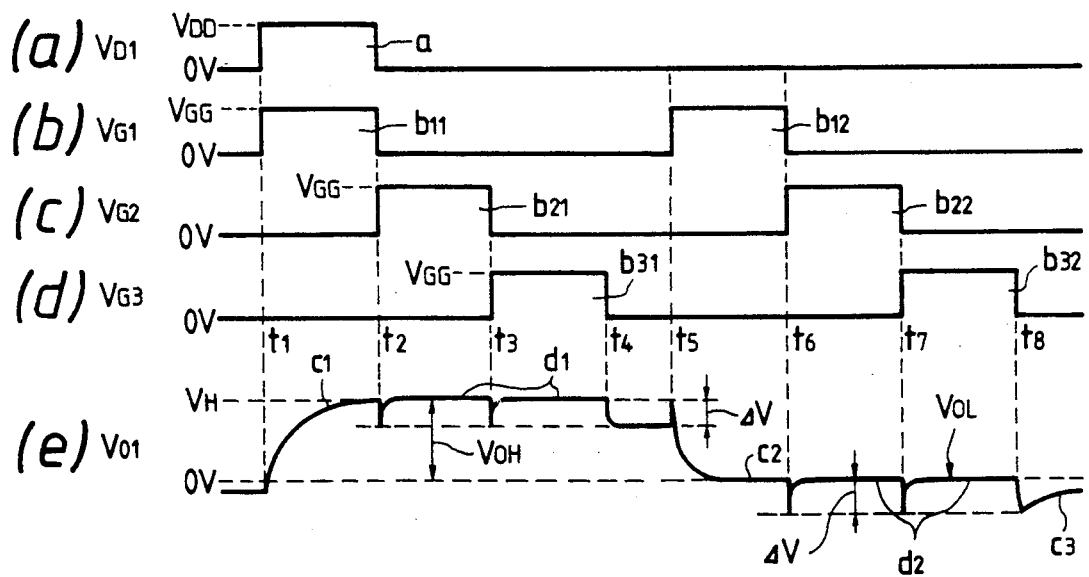
FIGS. 4(a) to 4(e) show waveforms for explaining the operation of one thin-film transistor depicted in FIG. 3.

In the following, the operation of each thin-film transistor is described in detail with reference to an arbitrary thin-film transistor (for example, $Q_1$) in connection with FIG. 4. FIG. 4 shows waveform diagrams for explaining the operation of one thin-film transistor in FIG. 3. FIGS. 4(a)-4(e) show a data signal $V_{D1}$, a gate signal $V_{G1}$, a gate signal $V_{G2}$, a gate signal $V_{G3}$, and an output signal $V_{O1}$, respectively.

Figure 1:
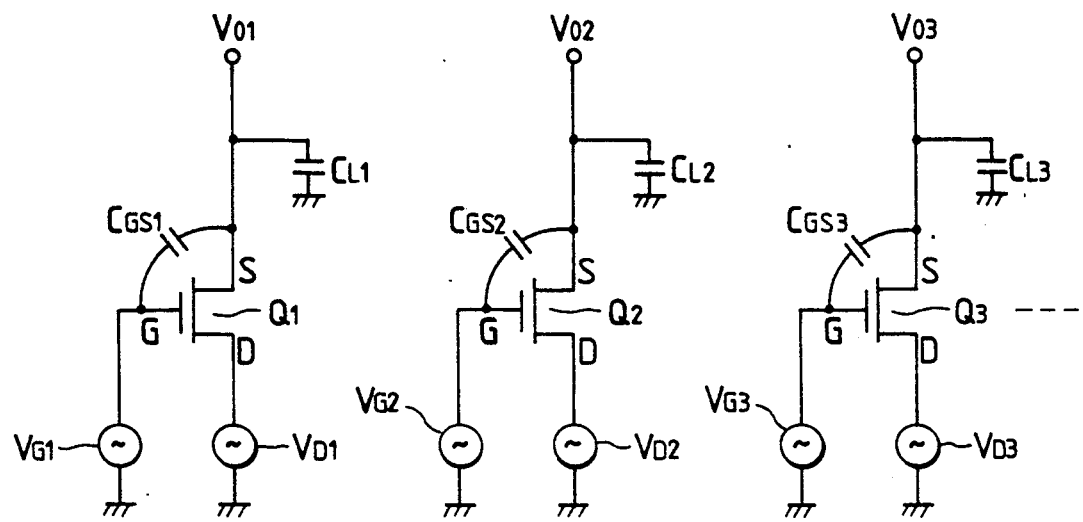
FIG. 1 is a diagram showing an example of a conventional thin-film transistor array.

The operation of a thin-film transistor array of FIG. 3 in the periods is the same as that of FIG. 1 except the gate signal changing periods where the feed-through phenomenon occurs. Therefore, the following description will be made only with respect to the gate signal changing periods.

(1) Operation at $t_2$

A pulse $b_{11}$ of the gate signal $V_{G1}$ for the thin-film transistor $Q_1$ falls at $t_2$, so that the output signal $V_{O1}$ instantly drops (by $\Delta V$) correspondly due to the feed-through phenomenon via the gate-source capacitance $C_{GS1}$.

On the other hand, a pulse $b_{21}$ of the gate signal $V_{G2}$ for the adjacent thin-film transistor $Q_2$ rises at this moment. This potential rise of the pulse $b_{21}$ is transmitted to the output side of the thin-film transistor $Q_1$ via the feed-through correction capacitance $C_{F12}$. Because the high level value $V_{GG}$ of the gate signal $V_{G2}$ is equal to that of the gate signal $V_{G1}$, the output signal is increased, via the feed-through correction capacitance $C_{F12}$, by the same amount as the voltage drop caused by the fall of the gate signal $V_{G1}$.

Accordingly, the output signal $V_{O1}$ is substantially kept at the output high-level peak $V_H$, except an instant voltage drop at $t_2$. In other words, the relation "(output high level $V_{OH}$)=(output high-level peak $V_H$)" is established substantially. A waveform of $V_{O1}$ in this period is denoted by $d_1$ in FIG. 4(e).

(2) Operation at the Time $t_3$

The pulse $b_{21}$ of the gate signal $V_{G2}$ for the thin-film transistor $Q_2$ falls at $t_3$, so that the output signal $V_{O1}$ drops instantly through the feed-through correction capacitance $C_{F12}$.

On the other hand, a pulse $b_{31}$ of the gate signal $V_{G3}$ for the thin-film transistor $Q_3$ rises at this moment $t_3$. The rise of the pulse $b_{31}$ is transmitted to the output side of the thin-film transistor $Q_1$ through the feed-through correction capacitance $C_{F13}$. Accordingly, the output signal $V_{O1}$ is returned to the output high-level peak $V_H$ in the same manner as at $t_2$.

(3) Operation from $t_4$ to $t_5$

The pulse $b_{31}$ of the gate signal $V_{G3}$ falls at the time $t_4$, so that the fall of the pulse $b_{31}$ is transmitted to the output side of the thin-film transistor $Q_1$ through the feed-through correction capacitance $C_{F13}$ to thereby reduce the output signal $V_{O1}$.

A gate signal rise at $t_4$ and a feed-through correction capacitance for transmitting the rise of the gate signal to the thin-film transistor $Q_1$ are required to cancel the voltage drop of the output signal. Since such a gate signal and feed-through correction capacitance are not provided in FIG. 3, the voltage drop of the output signal is not canceled in this case. This explains the fact that the output signal $V_{O1}$ stays dropped by $\Delta V$ in a period from $t_4$ to $t_5$ in FIG. 4(e). The reason why the output signal is left in the drop state in this period will be described later.

(4) Operation from $t_5$ to $t_6$

A pulse $b_{12}$ of the gate signal $V_{G1}$ rises at the time $t_5$, so that the output voltage $V_{O1}$ increases by $\Delta V$ due to the feed-through phenomenon via the gate-source capacitance $C_{GS1}$.

However, this time, since the value of the data signal $V_{D1}$ is zero while the pulse $b_{12}$ exists, the output signal $V_{O1}$ which has once increased is reduced to zero rapidly (waveform $c_2$). This state of zero voltage of the output signal is kept until the time $t_6$.

(5) Operation at $t_6$ and at $t_7$

The output signal $V_{O1}$ instantly drops but is immediately returned by the effect of the feed-through correction capacitance in the same manner as at $t_2$ and $t_3$. Consequently, the value of the output signal $V_{O1}$ is kept zero (waveform $d_2$ in FIG. 4(e)).

(6) Operation at and after $t_8$

At the time $t_8$ a pulse $b_{32}$ of the gate signal $V_{G3}$ falls. At this moment $t_8$, the output signal $V_{O1}$ drops corresponding to the fall of the pulse $b_{32}$ in the same manner as at $t_4$, and there is nothing to cancel the drop.

Figure 2:
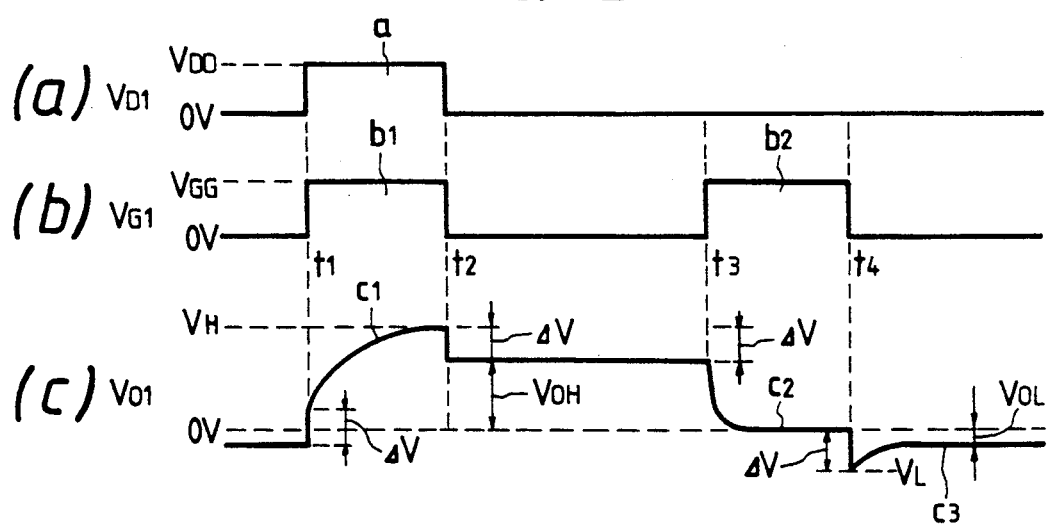
FIGS. 2(a) to 2(c) show waveforms for explaining the operation of one thin-film transistor depicted in FIG. 1.

Accordingly, the output signal changes after $t_8$ in the similar manner as after the time $t_4$ in the conventional example shown in FIG. 2 (waveform $c_3$). That is, the value of the output signal instantly decreases by $\Delta V$ and then increases gradually to be ultimately settled to the threshold voltage $V_{th}$ of the thin-film transistor $Q_1$.

The output signal $V_{O1}$ obtained as the result of the aforementioned operation is different, in the following points, from the output signal obtained in the prior art.

(1) The output high level $V_{OH}$ coincides with the output high-level peak $V_H$. Accordingly, there is no necessity of establishing the data signal $V_{D1}$ made higher in anticipation of the drop $\Delta V$ due to the feed-through phenomenon.

(2) The output low level $V_{OL}$ is kept zero, and hence stabilized. Accordingly, errors are reduced even when the thin-film transistor array is used in an image processing device or the like to attain a tonal feature.

In the prior art, on the contrary, the output low level $V_{OL}$ is equal to the threshold voltage $V_{th}$ of the thin-film transistor, and hence it changes widely, that is, is not stable during the operation.

(3) The period in which the output signal is kept at a predetermined value by compensation of the drop of the output signal due to the feed-through phenomenon can be determined by the pulse width of the gate signals and the number of the feed-through correction capacitances connected to the thin-film transistor of interest.

In the case of the configuration shown in FIG. 3, as shown in FIG. 4(e), a period of two pulse widths is added by connection of the two feed-through correction capacitances, so that in an approximate period of three pulse widths the output signal is held at $V_{OH}$.

The length of this period is determined in consideration of the time required to complete an operation to be conducted by utilization of the output high level $V_{OH}$ or output low level $V_{OL}$. It is unnecessary to cancel the voltage drop after the completion of the operation. This is the reason why the voltage drop is not compensated for in the periods from $t_4$ to $t_5$ and after $t_8$.

Figure 5:
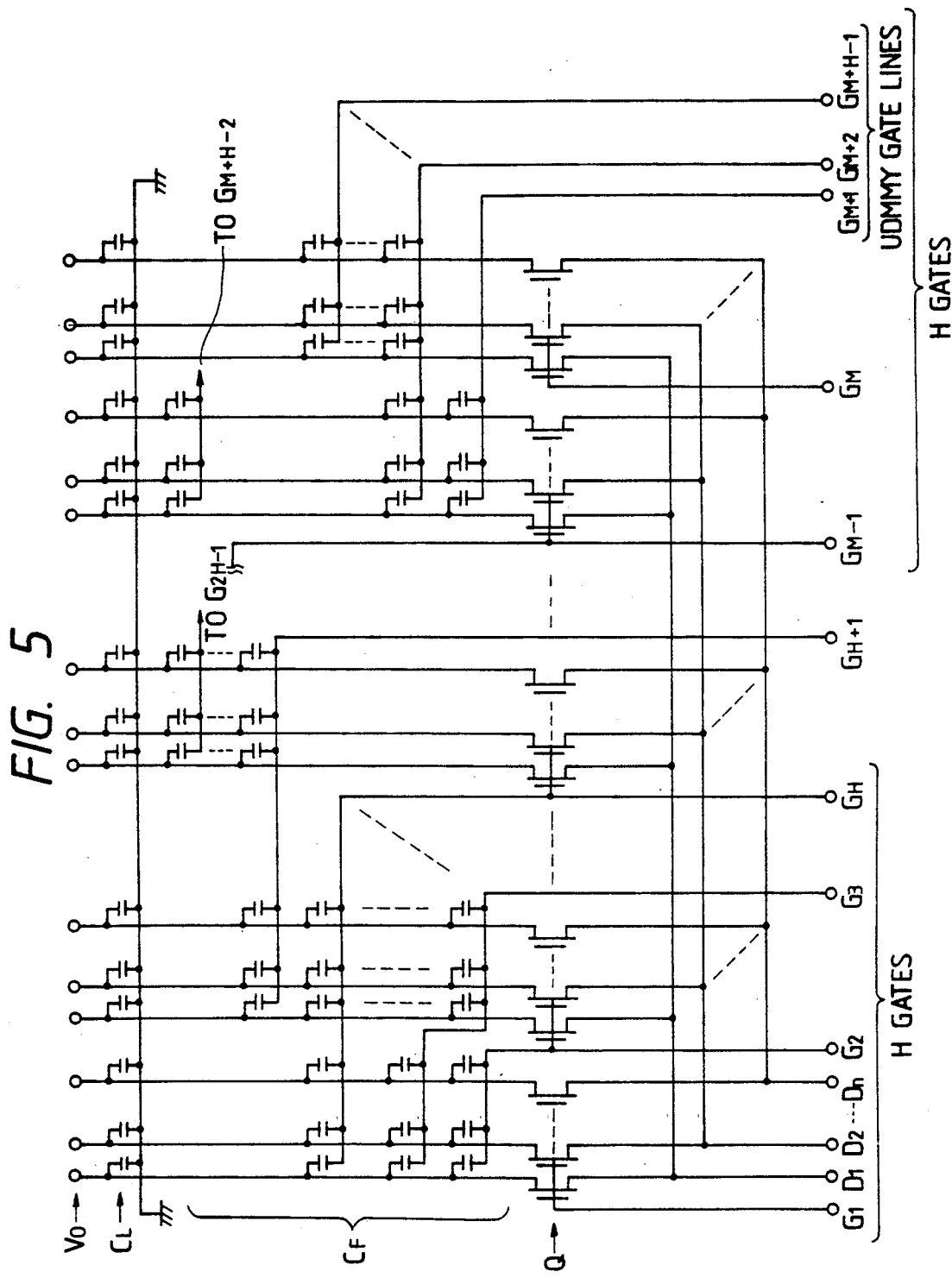
FIG. 5 is a diagram showing an embodiment of the present invention.

FIG. 5 is a diagram showing a specific embodiment of the present invention. In FIG. 5: Q represents thin-film transistors which form a thin-film transistor array; $C_L$, load capacitances; $C_F$, feed-through correction capacitances; $G_1$ to $G_M$, gate lines; $G_{M+1}$ to $G_{M+H-1}$, dummy gate lines; and $D_1$ to $D_n$, data lines.

FIG. 5 shows an example of a thin-film transistor array composed of M blocks each containing n thin-film transistors Q controlled by a gate signal supplied from one gate line. Therefore, M gate lines $G_1$ to $G_M$ are provided in this embodiment.

The period during which the voltage drop due to the feed-through phenomenon is compensated for is established to be a period of H gate signal pulses. Therefore, feed-through correction capacitances $C_F$ are respectively connected between one block and H-1 succeeding gate lines.

Blocks at the end portion of the array have a shortage of succeeding gate lines. To solve this problem, the last block, for example, is connected to H-1 dummy gate lines via the feed-through correction capacitances $C_F$.

What is claimed is:

1. A thin-film transistor array comprising:
   an array of thin-film transistors;
   one or a plurality of data lines for providing a data signal to said thin-film transistors;
   a plurality of gate lines for providing gate signals to said thin-film transistors, respectively; and
   a plurality of feed-through correction capacitances each connected between an output terminal of one of said thin-film transistors and one of said gate lines which is for gating a thin-film transistor located subsequent to said one thin-film transistor; wherein
   a first predetermined number of said feed-through capacitances are connected to an output terminal of each of said thin-film transistors.

2. A thin-film transistor array as claimed is claim 1, wherein said thin-film transistors are in turn provided with said gate signals such that when one gate signal is turned off, a next gate signal for gating a thin-film transistor directly subsequent to said one thin-film transistor is turned on.

3. A thin-film transistor array as claimed in claim 1, further comprising:
   dummy gate lines for providing dummy gate signals to dummy feed-through correction capacitances; and
   said dummy feed-through correction capacitances each connected between one of said dummy gate lines and an output terminal of one of a part of said thin-film transistors located at an end portion of said array; wherein an output terminal of every thin-film transistor is connected to said first predetermined number of said gate lines and said dummy gate lines.

4. A thin-film transistor array as claimed in claim 1, wherein said array comprises a plurality of blocks of said thin-film transistors, each block comprising a second predetermined number of said thin-film transistors provided with a same gate signal.

5. A thin-film transistor array as claimed in claim 1, further comprising a plurality of load capacitances connected to output terminals of said thin-film transistors, respectively.

6. A thin-film transistor array as claimed is claim 1, wherein each of said thin-film transistors is a field-effect transistor.

* * * * *